US009111913B2

(12) United States Patent
Choi (10) Patent No.: US 9,111,913 B2
(45) Date of Patent: Aug. 18, 2015

(54) SEMICONDUCTOR PACKAGE (71) Applicant: Keun Ho Choi, Asan-si (KR)

(72) Inventor: Keun Ho Choi, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/225,410

(22) Filed: Mar. 25, 2014

(65) Prior Publication Data

US 2014/0374893 A1 Dec. 25, 2014

(30) Foreign Application Priority Data

Jun. 25, 2013 (KR) .................. 10-2013-0073236

(51) Int. Cl.
*H01L 23/34* (2006.01)
*H01L 23/495* (2006.01)
*H01L 23/02* (2006.01)
*H01L 23/48* (2006.01)
*H01L 25/065* (2006.01)
*H01L 23/498* (2006.01)
*H01L 23/538* (2006.01)
(Continued)

(52) U.S. Cl.
CPC ........ *H01L 23/481* (2013.01); *H01L 23/49816* (2013.01); *H01L 23/5384* (2013.01); *H01L 23/5386* (2013.01); *H01L 25/0652* (2013.01); *H01L 23/3128* (2013.01); *H01L 24/13* (2013.01); *H01L 24/16* (2013.01); *H01L 24/32* (2013.01); *H01L 24/48* (2013.01); *H01L 24/49* (2013.01); *H01L 24/73* (2013.01); *H01L 25/0655* (2013.01); *H01L 2224/0401* (2013.01); *H01L 2224/04042* (2013.01); *H01L 2224/06135* (2013.01); *H01L 2224/131* (2013.01); *H01L 2224/16225* (2013.01); *H01L 2224/16235* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49175* (2013.01); *H01L 2224/73265* (2013.01); *H01L 2225/0651* (2013.01); *H01L 2225/06506* (2013.01); *H01L 2225/06562* (2013.01); *H01L 2924/1431* (2013.01); *H01L 2924/1434* (2013.01); *H01L 2924/15311* (2013.01)

(58) Field of Classification Search
CPC .......................... H01L 23/481; H01L 23/4952
USPC ......................................... 257/723, 676, 686
See application file for complete search history.

(56) References Cited

U.S. PATENT DOCUMENTS 5,912,809 A 6/1999 Steigerwald et al.
6,621,155 B1 * 9/2003 Perino et al. .................. 257/686
(Continued)

FOREIGN PATENT DOCUMENTS

KR 100762878 B1 10/2007
KR 101000573 B1 12/2010
KR 101078742 11/2011

*Primary Examiner* — Luan C Thai
(74) *Attorney, Agent, or Firm* — Renaissance IP Law Group LLP (57) ABSTRACT

A semiconductor package, comprising: a package substrate including chip regions, a separation region between the chip regions, and an edge region around the chip and separation regions; semiconductor chips disposed on the chip regions of the package substrate; and signal patterns. The package substrate comprises an upper layer substantially adjacent to the semiconductor chips, a lower layer including interconnection structures disposed in the chip regions, and an intermediate layer between the upper and lower layers, the intermediate layer includes through holes disposed only outside of the separation region; and the signal patterns are in contact with the interconnection structures through the through holes.

13 Claims, 8 Drawing Sheets

(51) Int. Cl.
*H01L 23/31* (2006.01)
*H01L 23/00* (2006.01)

(56) References Cited

U.S. PATENT DOCUMENTS

| | | |
|---|---|---|
| 8,008,767 B2 | 8/2011 | Wada et al. |
| 8,014,154 B2 | 9/2011 | Lee |
| 8,216,668 B2 | 7/2012 | Kimura |
| 8,232,631 B2 * | 7/2012 | Cho ............................ 257/686 |
| 8,367,943 B2 | 2/2013 | Wu et al. |
| 8,742,499 B2 * | 6/2014 | Nakajima et al. ............ 257/341 |
| 2008/0073784 A1 | 3/2008 | Lee |
| 2008/0314632 A1 | 12/2008 | Wu et al. |
| 2009/0267212 A1 | 10/2009 | Wada et al. |
| 2010/0065315 A1 | 3/2010 | Kimura |
| 2012/0049351 A1 | 3/2012 | Lee |

* cited by examiner

SEMICONDUCTOR PACKAGE

CROSS-REFERENCE TO RELATED APPLICATIONS

This U.S. non-provisional patent application claims priority under 35 U.S.C. §119 to Korean Patent Application No. 10-2013-0073236, filed on Jun. 25, 2013, in the Korean Intellectual Property Office, the entire contents of which are hereby incorporated by reference.

BACKGROUND

Embodiments relate to a semiconductor package, and in particular, to a semiconductor package with improved reliability.

There is an increasing demand for semiconductor products with reduced size and improved data-processing performance. In addition, to increase a capacity of a semiconductor package, a stack package technology including a plurality of semiconductor chips vertically stacked in one semiconductor package has been widely used. A stack-type package fabricated by the stack package technology can provide advantages in terms of density and weight, but still suffers from a reliability issue.

SUMMARY

An embodiment includes a semiconductor package, comprising: a package substrate including chip regions, a separation region between the chip regions, and an edge region around the chip and separation regions; semiconductor chips disposed on the chip regions of the package substrate; and signal patterns. The package substrate comprises an upper layer substantially adjacent to the semiconductor chips, a lower layer including interconnection structures disposed in the chip regions, and an intermediate layer between the upper and lower layers, the intermediate layer includes through holes disposed only outside of the separation region; and the signal patterns are in contact with the interconnection structures through the through holes.

Another embodiment includes a semiconductor package, comprising: a package substrate including chip regions and a separation region between the chip regions; and semiconductor chips disposed on the chip regions of the package substrate. The package substrate comprises an upper layer with chip pads, a lower layer with interconnection structures, and an intermediate layer disposed between the upper and lower layers to have through vias; the intermediate layer comprises a plurality of insulating layers; and the through vias penetrating an insulating layer of the intermediate layer substantially adjacent the lower layer and in direct contact with the interconnection structures are disposed only outside the separation region.

Another embodiment includes semiconductor package, comprising: a substrate including a plurality of interconnection structures and a plurality of through structures, the through structures penetrating at least a part of the substrate; and a plurality of semiconductor chips disposed on the substrate, opposite the interconnection structures. The semiconductor chips are disposed on chip regions of the substrate; at least one separation region of the substrate is disposed between the chip regions; and a through structure of the through structures is disposed substantially adjacent to the interconnection structures is disposed only outside of the separation region.

BRIEF DESCRIPTION OF THE DRAWINGS

Embodiments will be more clearly understood from the following brief description taken in conjunction with the accompanying drawings. The accompanying drawings represent non-limiting embodiments as described herein.

DETAILED DESCRIPTION

Embodiments will now be described more fully with reference to the accompanying drawings, in which some embodiments are shown. Some embodiments may, however, take many different forms and should not be construed as being limited to the embodiments set forth herein; rather, these embodiments are provided so that this disclosure will be thorough and complete, and will fully convey the concept to those of ordinary skill in the art. In the drawings, the thicknesses of layers and regions are exaggerated for clarity. Like reference numerals in the drawings denote like elements, and thus their description will be omitted.

It should be noted that the figures are intended to illustrate the general characteristics of methods, structure and/or materials utilized in certain embodiments and to supplement the written description provided below. The figures are not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of some embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
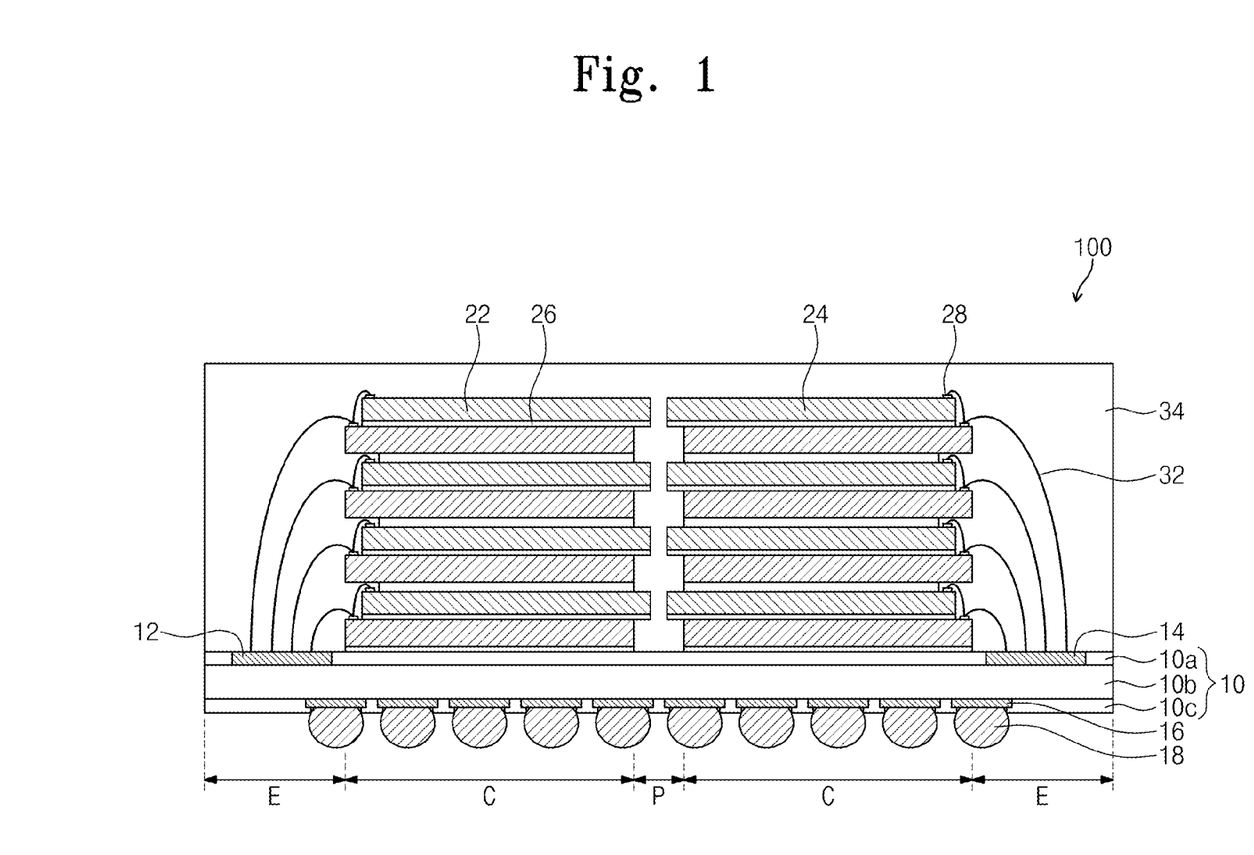
FIG. 1 is a sectional view illustrating a semiconductor package according to some embodiments.
Figure 2:
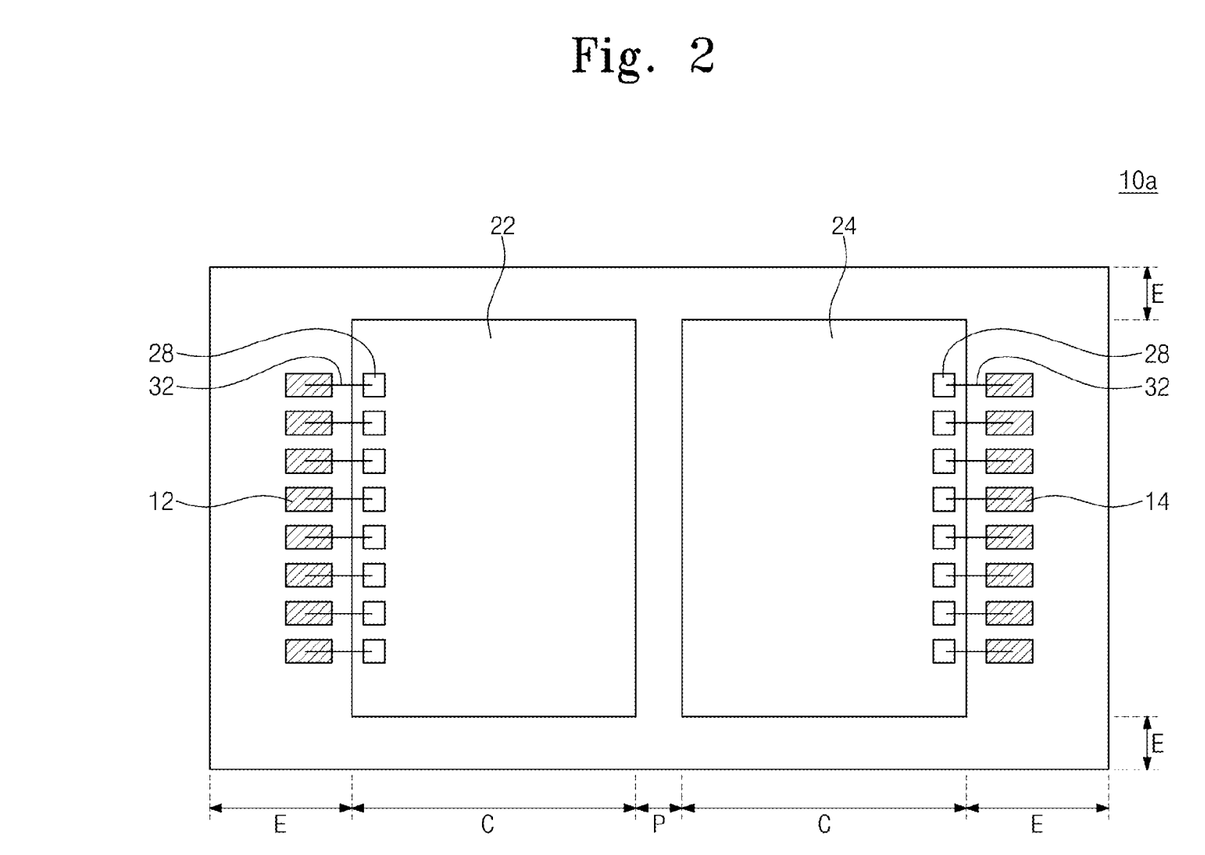
FIG. 2 is a plan view illustrating an upper layer of a package substrate of the semiconductor package of FIG. 1.
Figure 3:
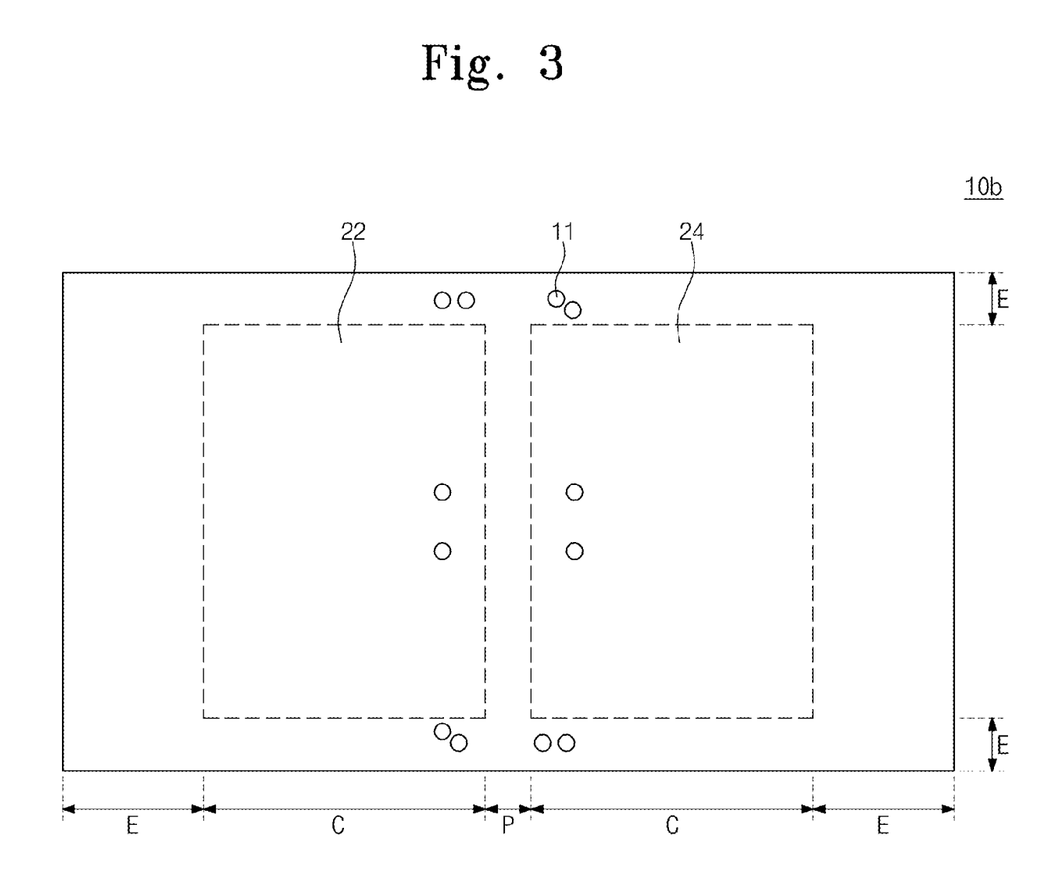
FIG. 3 is a plan view illustrating an intermediate layer of the package substrate of the semiconductor package of FIG. 1.
Figure 4:
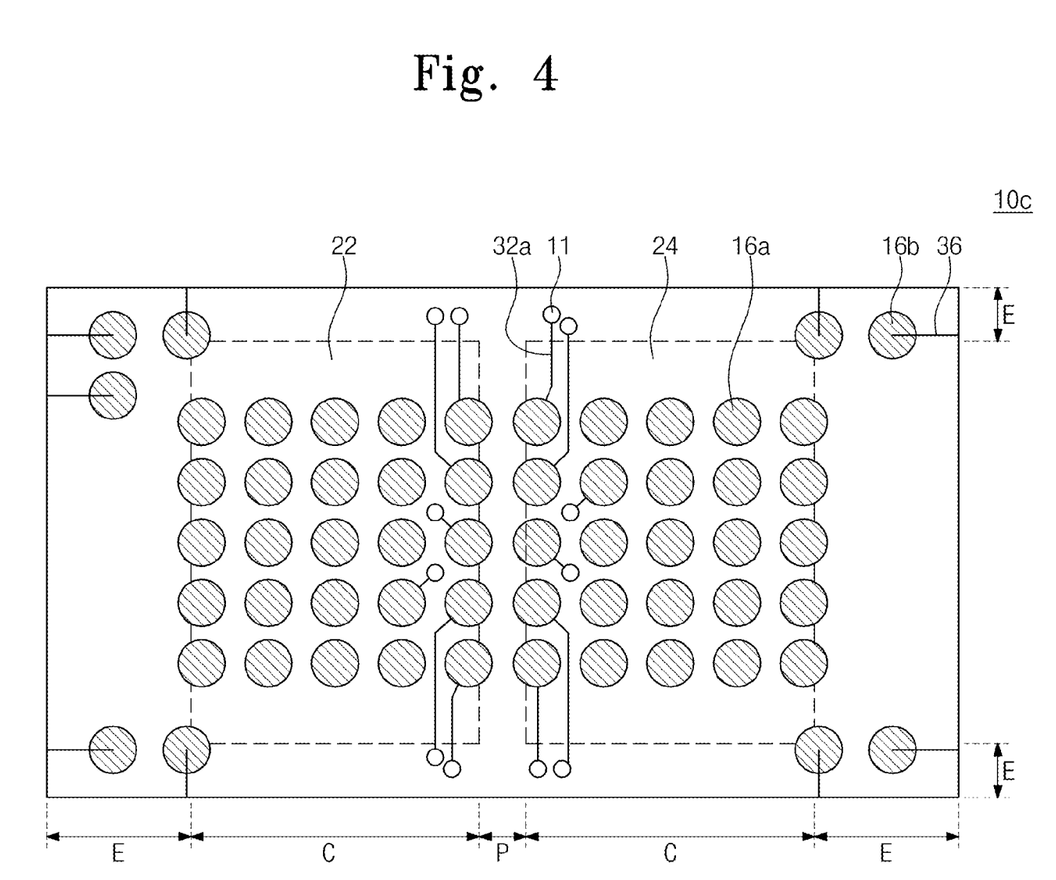
FIG. 4 is a plan view illustrating a lower layer of the package substrate of the semiconductor package of FIG. 1, according to some embodiments.

FIG. 1 is a sectional view illustrating a semiconductor package according to some embodiments. FIGS. 2 and 3 are plan views illustrating upper and intermediate layers, respectively, of a package substrate of the semiconductor package of FIG. 1, and FIG. 4 is a plan view illustrating a lower layer of the package substrate of the semiconductor package of FIG. 1, according to some embodiments.

Referring to FIG. 1, according to some embodiments, a semiconductor package 100 may include a package substrate 10. The package substrate 10 may include chip regions C, a separation region P between the chip regions C, and an edge region E. The package substrate 10 may be a printed circuit board, a flexible substrate, or a tape substrate. The package substrate 10 may include an upper layer 10a, an intermediate layer 10b, and a lower layer 10c. In some embodiments, at least one of the upper and lower layers 10a and 10c may include a copper pattern. For example, the package substrate 10 may be formed of a copper clad laminate. The intermediate layer 10b may include an insulating material.

First contact pads 12 and second contact pads 14 may be disposed in or on the upper layer 10a of the package substrate 10, and ball lands 16 may be disposed in or on the lower layer 10c of the package substrate 10. Outer terminals 18 may be attached on the ball lands 16, respectively. Although the term ball lands 16 has been used, the terminals 18 may be other interconnection structures other than balls and consequently, the ball lands 16 may be similar corresponding interconnection structures. The package substrate will be described in more detail below.

First semiconductor chips 22 and second semiconductor chips 24 may be disposed on the chip regions C of the package substrate 10. The first semiconductor chips 22 may be stacked on the package substrate 10, and they may be attached to each other by adhesive layers 26. Similarly, the second semiconductor chips 24 may be stacked on the package substrate 10, and they may be attached to each other by the adhesive layers 26. The first semiconductor chips 22 may be disposed spaced apart from the second semiconductor chips 24, on the package substrate 10. The first semiconductor chips 22 may be sequentially stacked in a zigzag manner, and the second semiconductor chips 24 may be sequentially stacked in a zigzag manner. Although a particular stacking arrangement of the semiconductor chips 22 and 24 has been illustrated, other stacking arrangements may be used.

For example, any stacking arrangement that substantially exposes chip pads 28 of the semiconductor chips 22 and 24. Moreover, the first semiconductor chips 22 and the second semiconductor chips 24 may, but need not be stacked in the same manner. Furthermore, in an embodiment, the lower semiconductor chips 22 and 24 of a given stack may define the chip regions C and the separation region P. Accordingly, a semiconductor chip 22 or 24 that is stacked on another semiconductor chip 22 and 24 may overhang the separation region P.

The first semiconductor chips 22 and the second semiconductor chips 24 may be memory chips, logic chips, or other semiconductor chips. The first semiconductor chips 22 and the second semiconductor chips 24 may be of the same or different kind. For example, all of the first semiconductor chips 22 may be memory chips, while all of the second semiconductor chips 24 may be logic chips. In other embodiments, different types of semiconductor chips may be stacked in the same stack. For example, the first semiconductor chips 22 may include multiple different types of semiconductor chips. Although a particular number of first semiconductor chips 22 and the second semiconductor chips 24 has been illustrated, in other embodiments, the number is not limited to the numbers of the first semiconductor chips 22 and the second semiconductor chips 24 illustrated in the drawings. Moreover, the number of first semiconductor chips 22 and the number of second semiconductor chips 24 may be different.

A molding layer 34 may be formed on the package substrate 10 to cover the first semiconductor chips 22 and the second semiconductor chips 24.

Chip pads 28 may be disposed on top surfaces of the first semiconductor chips 22 and the second semiconductor chips 24. Referring to FIG. 2, the chip pads 28 may be electrically connected to the first and second contact pads 12 and 14, which may be disposed on the edge region E of the package substrate 10, by bonding wires 32. For example, the chip pads 28 of the first semiconductor chips 22 may be connected in a one-to-one manner to the first contact pads 12, and the chip pads 28 of the second semiconductor chips 24 may be connected in a one-to-one manner to the second contact pads 14. Although the number of the first contact pads 12 and the second contact pads 14 may be the same as that of the chip pads 28, in other embodiments, a one-to-many or many-to-one correspondence may exist.

Referring to FIGS. 3 and 4, the intermediate layer 10b of the package substrate 10 may be formed to have through holes 11. The through holes 11 may be used as connection pathways electrically connecting some (e.g., signal patterns 32a) of the bonding wires 32 to chip ball lands 16a disposed on or in the lower layer 10c. Each of the signal patterns 32a may be disposed in the corresponding one of the through holes 11. The through holes 11 may be formed through the chip regions C and the edge regions E of the package substrate 10.

The chip ball lands 16a may be arranged with a substantially uniform space in the chip regions C. In some embodiments, the chip ball lands 16a may be disposed in the chip regions C to be adjacent to the separation region P. The signal patterns 32a may be coupled with the through holes 11 to be in contact with the chip ball lands 16a through the intermediate layer 10b. At least one of the signal patterns 32a may be in contact with the chip ball lands 16a, respectively. The signal patterns 32a may extend from the corresponding through holes 11 toward the chip regions C adjacent thereto to be in contact with the chip ball lands 16a.

Peripheral ball lands 16b may be disposed on the edge region E. Metal lines 36 may be connected to the peripheral ball lands 16b, respectively. The metal lines 36 may constitute an interconnection structure formed on the package substrate 10. In some embodiments, the metal lines 36 may be plating lines formed by a plating process.

The signal patterns 32a may be disposed in the package substrate 10 to connect the semiconductor chips 22 and 24 to the chip ball lands 16a. For example, electric signals may be transmitted from the semiconductor chips 22 and 24 to the outside through the signal patterns 32a and the outer terminals 18. In the case where a plurality of the semiconductor chips 22 and 24 are disposed on the package substrate 10, the package substrate 10 may be configured to have the separation region P between the semiconductor chips 22 and 24. The signal patterns 32a may be disposed in the through holes 11, which may penetrate the intermediate layer 10b of the package substrate 10, to connect the semiconductor chips 22 and 24 to the outer terminals 18.

The package substrate 10 may have a different thermal expansion coefficient from the semiconductor chips 22 and 24. In the case where the through holes 11 are formed in the separation region P, due to the difference in thermal expansion coefficient between the package substrate 10 and the semiconductor chips 22 and 24, the signal patterns 32a may be cracked, and this may lead to deterioration in reliability of the semiconductor package.

In the case where the chip ball lands 16a are disposed in the chip regions C, the through holes 11 may be formed near the chip regions C and the edge region E of the intermediate layer 10b, and thus, the signal patterns 32a may not be disposed in the separation region P. For example, the signal patterns 32a may extend toward the chip regions C and be in contact with the chip ball land 16a. Accordingly, the semiconductor package 100 can have improved reliability.

Figure 5:
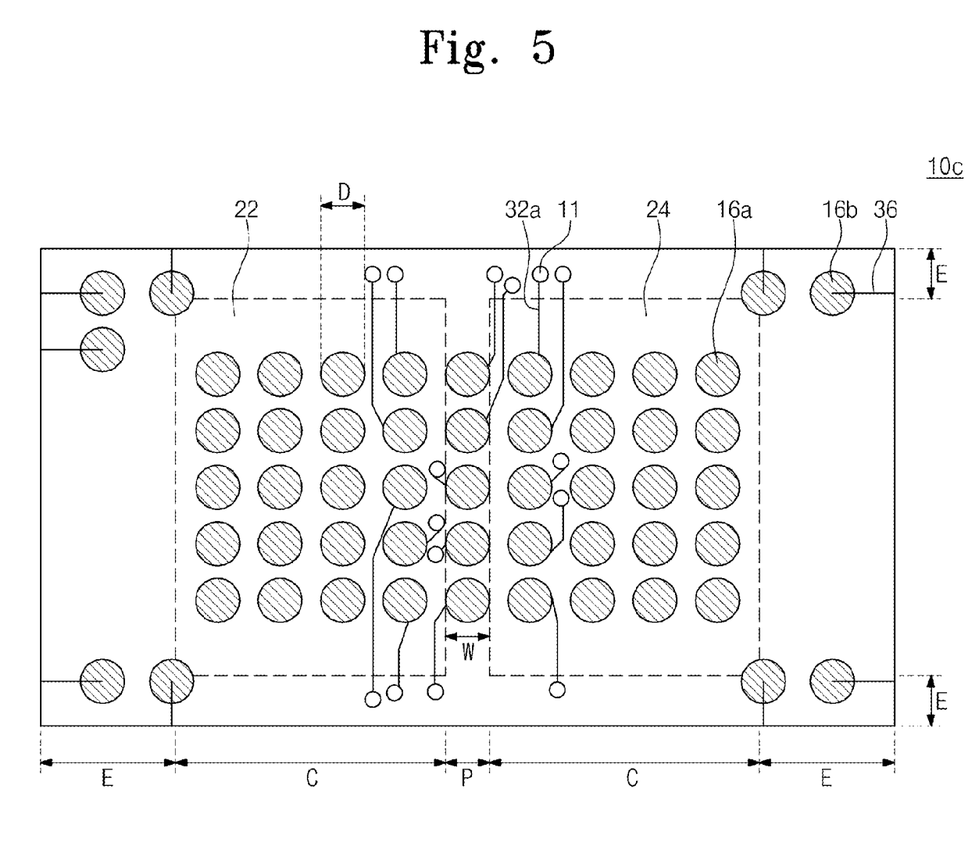
FIG. 5 is a plan view illustrating a lower layer of the package substrate of the semiconductor package of FIG. 1, according to other embodiments.
Figure 6:
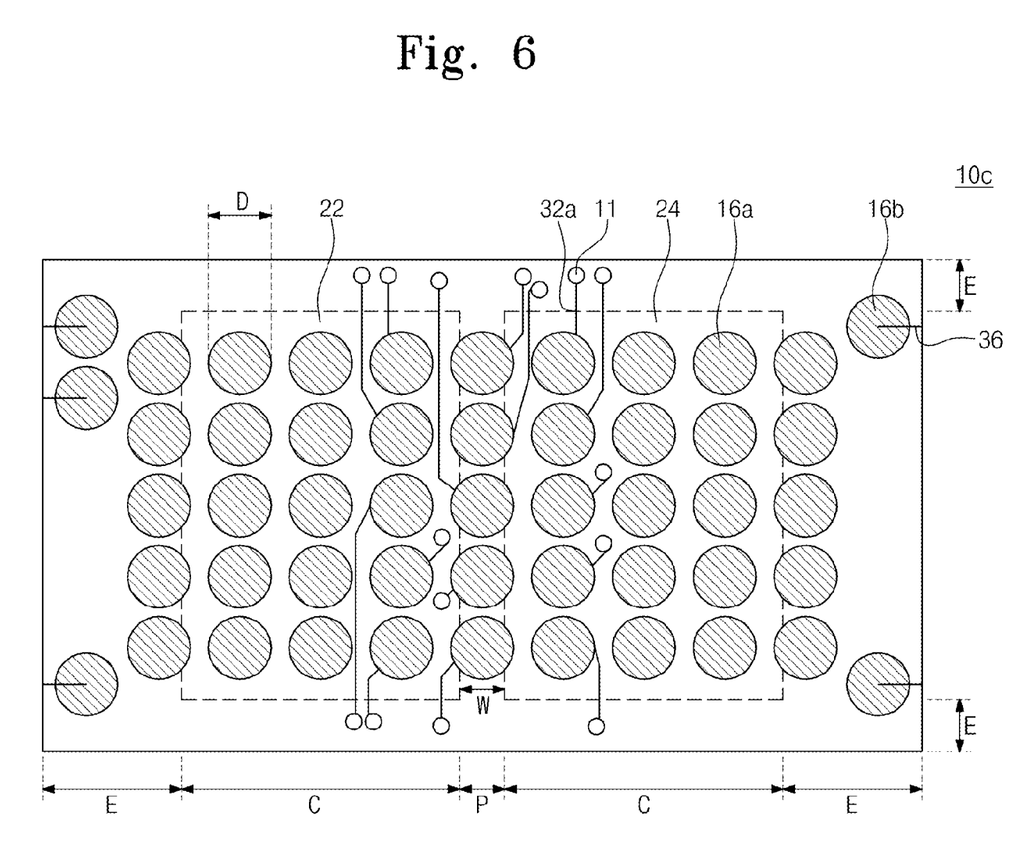
FIG. 6 is a plan view illustrating a lower layer of the package substrate of the semiconductor package of FIG. 1, according to still other embodiments.

FIG. 5 is a plan view illustrating a lower layer of the package substrate of the semiconductor package of FIG. 1, according to other embodiments. FIG. 6 is a plan view illustrating a lower layer of the package substrate of the semiconductor package of FIG. 1, according to still other embodiments.

Referring to FIGS. 5 and 6, the chip ball lands 16a may be disposed in the chip regions C and the separation region P of the package substrate 10. Each of the chip ball lands 16a may have a diameter D that is equivalent to or greater than a width W of the separation region P. Further, the signal patterns 32a may extend from the corresponding through holes 11 toward the chip regions C adjacent thereto to be in contact with the chip ball lands 16a. Accordingly, the signal patterns 32a can be in contact with the chip ball lands 16a, even when the signal patterns 32a do not have a portion located in the separation region P.

Figure 7:
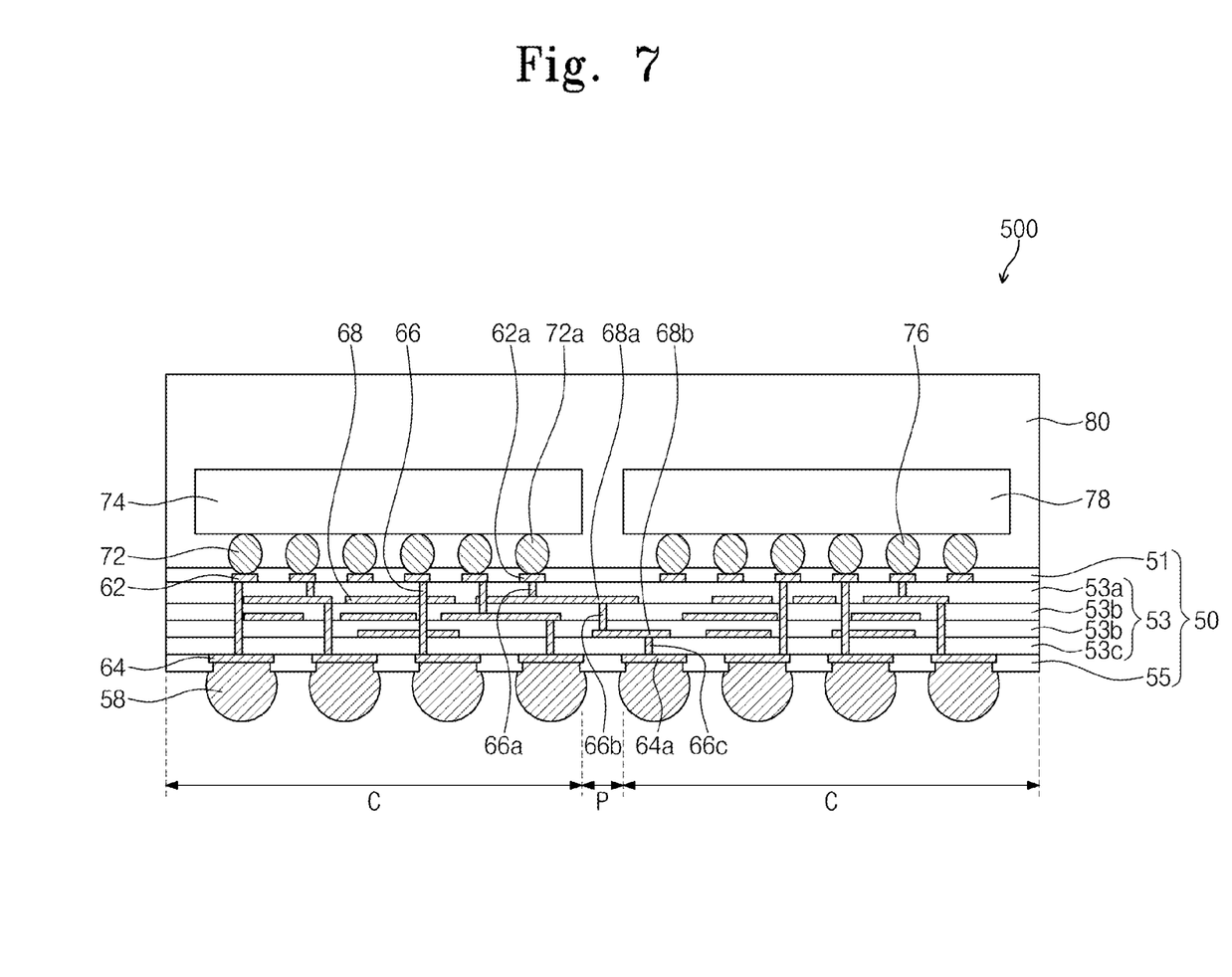
FIG. 7 is a sectional view illustrating a semiconductor package according to other embodiments.

FIG. 7 is a sectional view illustrating a semiconductor package according to other embodiments. According to other embodiments, a semiconductor package 500 may include a package substrate 50. The package substrate 50 may include chip regions C and a separation region P between the chip regions C. The package substrate 50 may be a printed circuit board, a flexible substrate, a tape substrate, or the like. The package substrate 50 may include an upper layer 51, an intermediate layer 53, and a lower layer 55. Chip pads 62 may be disposed in the upper layer 51 of the package substrate 50. Through vias 66 and interconnection lines 68 may be disposed in the intermediate layer 53, and ball lands 64 may be disposed in the lower layer 55. The ball lands 64 may be disposed in the chip regions C of the lower layer 55.

The intermediate layer 53 of the package substrate 50 may include a plurality of insulating layers 53a, 53b, and 53c. For example, the intermediate layer 53 may include an upper insulating layer 53a adjacent to the upper layer 51, a lower insulating layer 53c adjacent to the lower layer 55, and intermediate insulating layers 53b interposed between the upper insulating layer 53a and the lower insulating layer 53c. The through vias 66 may include signal patterns. The through vias 66 may connect the chip pads 62 electrically to the ball lands 64. For example, the through vias 66 may be formed through the intermediate layer 53. In the case where the chip pads 62 are connected to the ball lands 64 by only the through vias 66, it is necessary to form the through vias 66 in the chip regions C of the package substrate 50.

By contrast, in the case where the chip pads 62 and the ball lands 64 are in contact with the through via 66 that are different from each other and the through vias 66 are connected by the interconnection lines 68 disposed on the insulating layers 53a, 53b, and 53c, the through via 66 in contact with the ball lands 64 may be disposed in the chip regions C of the package substrate 50 and the through via 66 in contact with the chip pads 62 may be disposed in the separation region P.

For example, a first chip pad 62a may be in contact with a first solder ball 72a attached on a first semiconductor chip 74 and be connected to an upper first interconnection line 68a disposed on the upper insulating layer 53a through a first through via 66a. The upper first interconnection line 68a may be connected to an intermediate first interconnection line 68b disposed on the intermediate insulating layer 53b through a second through via 66b, and the intermediate first interconnection line 68b may be connected to a first ball land 64a through a third through via 66c. Although the first through via 66a is disposed on the chip region C, in some embodiments, the first through via 66a and the second through via 66b may be disposed on the separation region P. However, the third through via 66c penetrating the lower insulating layer 53c adjacent to the lower layer 55 may be disposed on the chip regions C. That is, in some embodiment, the third through via 66c is disposed outside of the separation region P. This is because the crack issue may be associated with positions of the signal patterns disposed in a layer (e.g., the lower insulating layer 55c) of the package substrate 50 that is located most adjacent to the ball lands 64. Accordingly, the through via 66 may be disposed not to penetrate the lower insulating layer 53c on the separation region P.

The first semiconductor chip 74 and a second semiconductor chip 78 may be disposed on the chip regions C, respectively, of the package substrate 50. First solder balls 72 may be attached on a surface of the first semiconductor chip 74. The first semiconductor chip 74 may be mounted on the package substrate 50, for example, in a flip-chip bonding manner or by attaching the first solder balls 72 to the chip pads 62. Similar to the first semiconductor chip 74, the second semiconductor chip 78 may be mounted on the package substrate 50 by attaching second solder balls 76, which may be disposed on a surface of the second semiconductor chip 78, to the chip pads 62.

Figure 8:
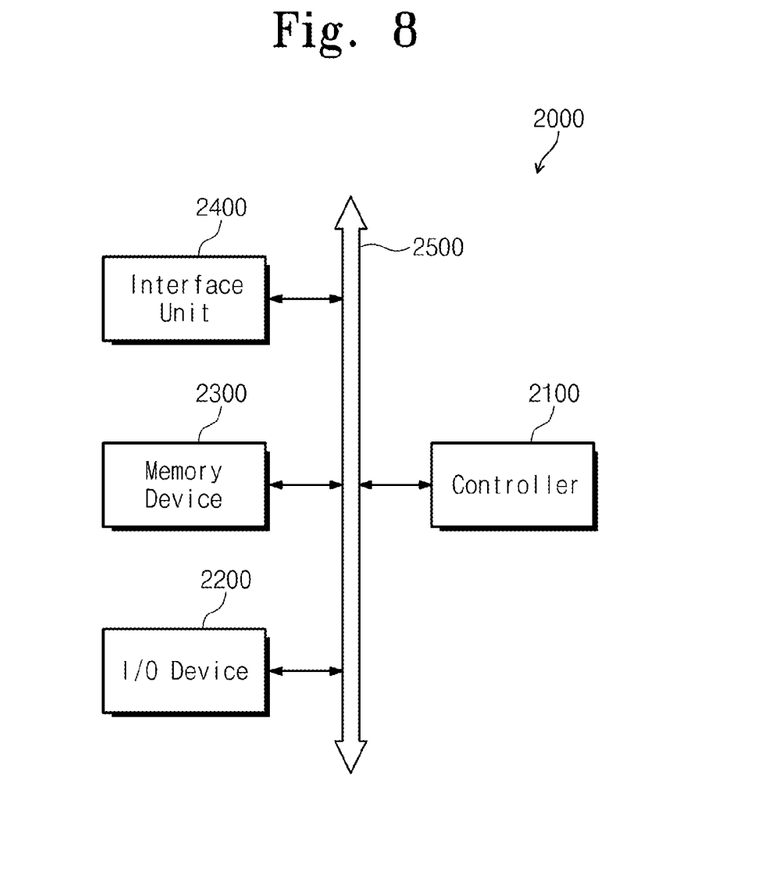
FIG. 8 is a block diagram illustrating an example of electronic systems including semiconductor packages according to some embodiments.
Figure 9:
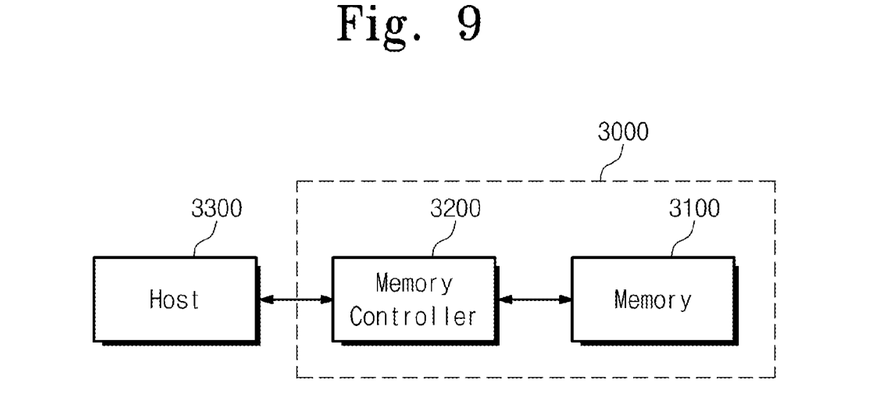
FIG. 9 is a block diagram illustrating an example of memory systems including semiconductor packages according to some embodiments.

FIG. 8 is a block diagram illustrating an example of electronic systems including semiconductor packages according to some embodiments. FIG. 9 is a block diagram illustrating an example of memory systems including semiconductor packages according to some embodiments.

Referring to FIG. 8, an electronic system 2000 according to an embodiment may include a controller 2100, an input/output (I/O) device 2200, a memory device 2300, a data bus 2500, or other similar components. At least two of the controller 2100, the I/O device 2200 and the memory device 2300 may communicate with each other through the data bus 2500. The data bus 2500 may correspond to a path through which electrical signals are transmitted. The controller 2100 may include at least one of a microprocessor, a digital signal processor, a microcontroller, a logic device, or the like. The logic device may have a similar function to any one of the microprocessor, the digital signal processor and the microcontroller. The controller 2100, I/O device 2200, memory device 2300, and/or interface unit 2400 may include at least one of the semiconductor packages described in the above embodiments. The I/O device 2200 may include at least one of a keypad, a keyboard and a display device. The memory device 2300 may be configured to store data and/or commands executed by the controller 2100. The memory device 2300 may include a volatile memory device and/or a nonvolatile memory device. For example, the memory device 2300 may include a flash memory device to which the package techniques according to an embodiment are applied. The flash memory device may constitute a solid state disk (SSD). In this case, the solid state disk including the flash memory device may stably store a large capacity of data. The electronic system 2000 may further include an interface unit 2400. The interface unit 2400 may transmit data to a communication network or may receive data from a communication network. The interface unit 2400 may operate by wireless or wired connections. For example, the interface unit 2400 may include an antenna for wireless communication or a transceiver for wired communication. Although not shown in the drawings, the electronic system 2000 may further include an application chipset, camera image sensor, or other additional devices or components.

The electronic system 2000 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 2000 performs wireless communication, the electronic system 2000 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 9, a memory card 3000 may include a memory 3100 and a memory controller 3200. The memory 3100 may be a non-volatile memory device or a volatile memory device. Using a non-volatile memory device as an example, the non-volatile memory device 3100 and the memory controller 3200 may store data or read stored data. The non-volatile memory device 3100 may include at least one non-volatile memory device, to which the semiconductor package technology according to some embodiments is applied. The memory controller 3200 may control the non-volatile memory device 3100 in order to read the stored data and/or to store data in response to read/write request of a host 3300.

According to some embodiments, a semiconductor package may include through holes penetrating an intermediate layer of a package substrate. The through holes may be disposed in chip or outer regions of the package substrate. A signal pattern connecting a semiconductor chip to a chip ball land may extend from the through hole toward a position between the chip regions, and thus, the signal pattern may not be disposed in a separation region that is vulnerable to be deformed by a difference in thermal expansion coefficient between the semiconductor chip and the package substrate. Accordingly, the signal pattern can be prevented from being cracked or damaged, and the semiconductor package can have improved reliability.

Although two stacks of semiconductor chips, such as those in FIG. 1, or two semiconductor chips, such as those in FIG. 7, have been described above, in some embodiments, any number of semiconductor chips or stacks of semiconductor chips may be present. According to a location of the semiconductor chips or stacks of semiconductor chips, the package substrate may be divided into multiple chip regions C, multiple separation regions P between the chip regions C, and an edge region E. That is, in some embodiments, the package substrate may include more than one separation region P and/or a differently shaped separation region P. Regardless of the number or shape of any separation regions P, signal patterns, vias, or the like may be disposed to be outside of the separation region P as described above.

Some embodiments provide a semiconductor package with improved reliability.

According to some embodiments, a semiconductor package may include a package substrate including chip regions, a separation region between the chip regions, and an edge region around the chip and separation regions, semiconductor chips disposed on the chip regions of the package substrate, and signal patterns. The package substrate may include an upper layer adjacent to the semiconductor chips, a lower layer including chip ball lands disposed in the chip regions, and an intermediate layer between the upper and lower layers. The intermediate layer may be disposed to include through holes, which are formed in the chip regions and/or the edge region and out of the separation region. The signal patterns may be in contact with the chip ball lands through the through holes.

In some embodiments, the signal patterns extend into the chip regions adjacent to the through holes.

In some embodiments, the chip ball lands may be disposed in the chip regions and the separation region.

In some embodiments, the chip ball lands have diameters that are equivalent to or greater than a width of the separation region.

In some embodiments, the semiconductor package may further include contact pads disposed in the edge region of the upper layer, chip pads disposed on the semiconductor chips, bonding wires connecting the contact pads to the chip pads, outer terminals attached to the chip ball lands, and a molding layer covering the semiconductor chips on the package substrate.

In some embodiments, the signal patterns constitute the bonding wires.

In some embodiments, the semiconductor package may further include peripheral ball lands disposed in the edge region of the lower layer.

According to some embodiments, a semiconductor package may include a package substrate including chip regions and a separation region between the chip regions, and semiconductor chips disposed on the chip regions of the package substrate. The package substrate may include an upper layer with chip pads, a lower layer with chip ball lands, and an intermediate layer disposed between the upper and lower layers to have through vias. The intermediate layer may include an upper insulating layer, an intermediate insulating layer, and a lower insulating layer. The through vias penetrating the lower insulating layer to be in direct contact with the chip ball lands are disposed in the chip regions.

In some embodiments, the semiconductor package may further include solder balls that are disposed on the semiconductor chips and are electrically connected to the chip pads.

In some embodiments, the through vias include a first through via penetrating the upper insulating layer, a second through via penetrating the intermediate insulating layer, and a third through via penetrating the lower insulating layer. The first and second through vias may be disposed in the chip regions or the separation region.

In some embodiments, the first, second, and third through vias may be connected by interconnection lines disposed on the upper, intermediate, and lower insulating layers.

In some embodiments, the chip ball lands may be disposed in the chip regions.

In some embodiments, the through vias include at least one signal pattern.

An embodiment includes a semiconductor package including a package substrate with chip regions, a separation region between the chip regions, and an edge region around the chip and separation regions, semiconductor chips disposed on the chip regions of the package substrate, and signal patterns. The package substrate may include an upper layer adjacent to the semiconductor chips, a lower layer including chip ball lands disposed in the chip regions, and an intermediate layer between the upper and lower layers. The intermediate layer may include through holes, which are formed in the chip regions and/or the edge region and out of the separation region. The signal patterns may be in contact with the chip ball lands through the through holes.

While some embodiments have been particularly shown and described, it will be understood by one of ordinary skill in the art that variations in form and detail may be made therein without departing from the spirit and scope of the attached claims.

What is claimed is:

1. A semiconductor package, comprising:
   a package substrate including a plurality of chip regions, a separation region between the chip regions, and an edge region around the chip and separation regions;
   a plurality of semiconductor chips disposed on the chip regions of the package substrate; and
   a plurality of signal patterns;
   wherein:
      the package substrate comprises an upper layer substantially adjacent to the semiconductor chips, a lower layer including interconnection structures disposed in the chip regions, and an intermediate layer between the upper and lower layers;
      the intermediate layer includes through holes disposed only outside of the separation region;
      the signal patterns are in contact with the interconnection structures through the through holes; and
      the signal patterns are disposed only outside of the separation region.

2. The semiconductor package of claim 1, wherein the interconnection structures are chip ball lands.

3. The semiconductor package of claim 1, wherein the through holes are disposed in at least one of the chip regions and the edge region.

4. The semiconductor package of claim 1, wherein the signal patterns extend into the chip regions adjacent to the through holes.

5. The semiconductor package of claim 1, wherein at least one of the interconnection structures are disposed in the separation region.

6. The semiconductor package of claim 5, wherein the interconnection structures have diameters that are equal to or greater than a width of the separation region.

7. The semiconductor package of claim 1, further comprising:
   contact pads disposed in the edge region of the upper layer;
   chip pads disposed on the semiconductor chips;
   bonding wires connecting the contact pads to the chip pads;
   outer terminals attached to the interconnection structures; and
   a molding layer covering the semiconductor chips on the package substrate.

8. The semiconductor package of claim 7, wherein the signal patterns include the bonding wires.

9. The semiconductor package of claim 1, further comprising peripheral ball lands disposed in the edge region of the lower layer.

10. A semiconductor package, comprising:
    a substrate including a plurality of interconnection structures and a plurality of through structures, the through structures penetrating at least a part of the substrate; and
    a plurality of semiconductor chips disposed on the substrate, opposite the interconnection structures; and
    a plurality of signal patterns, the signal patterns are provided into the through structures to contact with the interconnection structures;
    wherein:
       the semiconductor chips are disposed on chip regions of the substrate;
       at least one separation region of the substrate is disposed between the chip regions;
       a through structure of the through structures is disposed substantially adjacent to the interconnection structures;
       the through structures are disposed only outside of the separation region; and
       the signal patterns are disposed only outside of the separation region.

11. The semiconductor package of claim 10, wherein the through structures include at least one of through holes and through vias.

12. The semiconductor package of claim 10, wherein a through structure of the through structures disposed further from the interconnection structures than the through structure disposed substantially adjacent to the interconnection structures is disposed in the separation region.

13. The semiconductor package of claim 10, wherein at least one of the semiconductor chips is stacked on another semiconductor chip of the semiconductor chips and overhangs the separation region.

* * * * *